United States Patent [19]
Kellerman

[11] Patent Number: 5,856,674
[45] Date of Patent: Jan. 5, 1999

[54] FILAMENT FOR ION IMPLANTER PLASMA SHOWER

[75] Inventor: Peter L. Kellerman, Essex, Mass.

[73] Assignee: Eaton Corporation, Cleveland, Ohio

[21] Appl. No.: 931,689

[22] Filed: Sep. 16, 1997

[51] Int. Cl.⁶ .................................................. H01J 37/317
[52] U.S. Cl. ................................. 250/423 F; 250/492.21; 250/251
[58] Field of Search ................. 250/423 F, 492.21, 250/251; 313/337, 341, 344, 346 R

[56] References Cited

U.S. PATENT DOCUMENTS

| | | | |
|---|---|---|---|
| 4,361,762 | 11/1982 | Douglas | 250/251 |
| 4,463,255 | 7/1984 | Robertson et al. | 250/251 |
| 4,675,530 | 6/1987 | Rose et al. | 250/492.2 |
| 4,804,837 | 2/1989 | Farley | 250/251 |
| 4,825,087 | 4/1989 | Renau et al. | 250/492.2 |
| 4,994,674 | 2/1991 | Tamai et al. | 250/492.2 |
| 5,164,599 | 11/1992 | Benveniste | 250/492.2 |
| 5,399,871 | 3/1995 | Ito et al. | 250/492.21 |
| 5,531,420 | 7/1996 | Benveniste | 250/251 |

*Primary Examiner*—Kiet T. Nguyen
*Attorney, Agent, or Firm*—John A. Kastelic

[57] ABSTRACT

A ribbon filament (86) is provided for a thermionic emission device. The filament comprises an elongated body having a configuration defined by a length, a width, and a thickness. The length comprises a central portion (96) and first and second end portions (98) on either side of the central portion. The width of the central portion is greater than that of the first and second end portions. In addition, the thickness of the filament is substantially less than the width along its entire length. The ribbon filament (86) may be configured as a single helical coil having its first and second end portions (98) mounted to first and second legs (85), respectively, at locations of slots therein. Preferably, the filament (86) is comprised of tungsten and the first and second legs (85) are also comprised of tungsten.

10 Claims, 3 Drawing Sheets

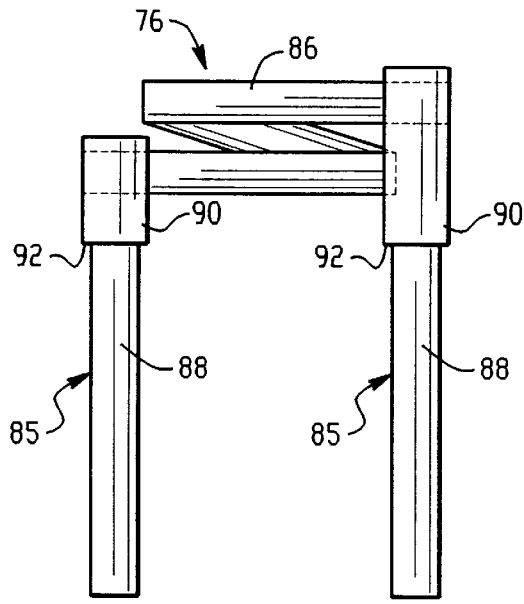
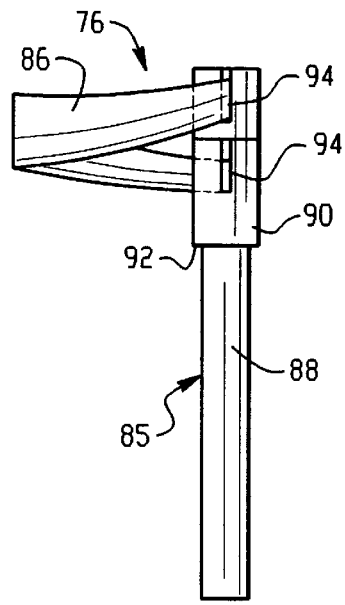
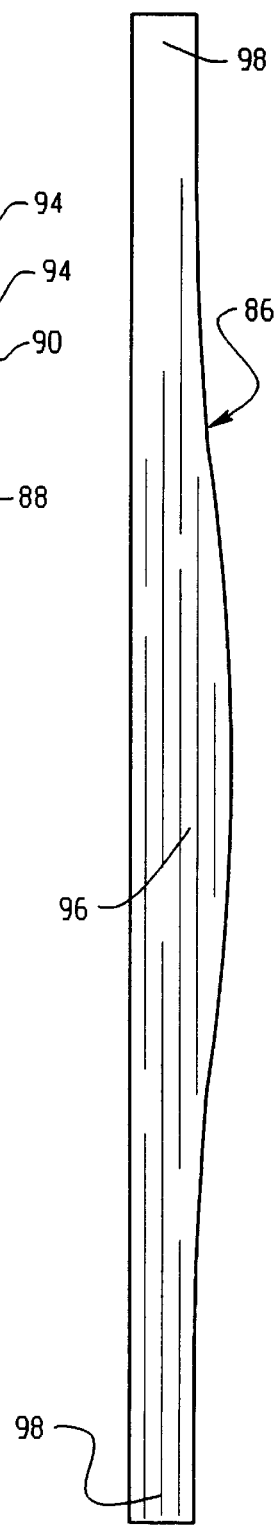
Fig. 3
Fig. 4
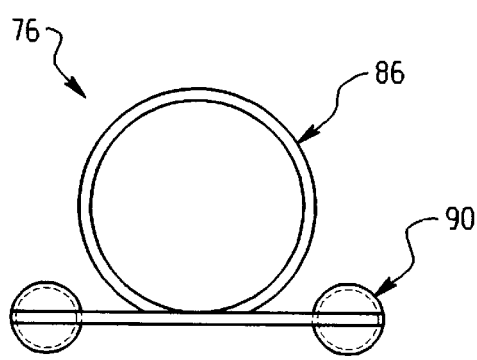
Fig. 5
Fig. 6

FILAMENT FOR ION IMPLANTER PLASMA SHOWER

FIELD OF THE INVENTION

The present invention relates generally to the field of ion implanters, and more specifically to an improved filament for a plasma shower in an ion implanter.

BACKGROUND OF THE INVENTION

Ion implantation has become the technology preferred by industry to dope semiconductors with impurities in the large scale manufacture of integrated circuits. A typical ion implanter comprises three sections or subsystems: (i) a terminal for outputting an ion beam, (ii) a beamline for directing and conditioning the beam output by the terminal, and (iii) a target chamber which contains a semiconductor wafer to be implanted by the conditioned ion beam. The terminal includes a source from which a beam of positively charged ions is extracted. The beamline components adjust the energy level and focus of the extracted positively charged ion beam on its way toward the target wafer.

A problem encountered in the use of such an ion implanter is that of wafer charging. As the positively charged ion beam continues to impact the target wafer, the surface of the wafer may accumulate an undesirable excessive positive charge. This accumulated positive charge is often non-uniform in its distribution across the surface of the wafer. Resulting electric fields at the wafer surface can damage microcircuitry on the wafer. The problem of accumulated surface charge becomes more pronounced as implanted circuit elements become smaller, because smaller circuit elements are more susceptible to damage caused by the resultant electric fields.

A known solution to the wafer charging phenomenon is the use of a plasma shower. A typical plasma shower includes an arc chamber in which an inert gas is ionized to produce a plasma comprised at least partially of low energy electrons, and a plasma chamber into which the plasma is extracted from the arc chamber and through which the ion beam passes. The plasma chamber contains a filament which is electrically heated so that it thermionically emits high energy electrons into the plasma chamber. The high energy electrons collide with inert gas molecules to create the plasma which includes low energy electrons capable of being trapped within the ion beam. The trapped low energy electrons thereby neutralize the net charge of the beam which in turn reduces the positive charge accumulation on wafer as the ion beam strikes the wafer surface. Such a system is shown in U.S. Pat. No. 4,804,837 to Farley, assigned to the assignee of the present invention and incorporated by reference as if fully set forth herein.

Plasma showers for neutralizing positively charge ion beams typically utilize helical coil or "pigtail" type filaments, having a uniform cross section along the entire length thereof, to produce thermionic emission of electrons (see, e.g., U.S. Pat. No. 4,463,255 to Robertson et al. and U.S. Pat. No. 5,399,871 to Ito et al.). Such helical filaments, however, present several operational impediments. For example, the uniform cross section of the coil filament provides for a uniform resistivity along the length thereof, which provides a corresponding uniform heat generation along the length thereof (i.e., as much heat is conducted by the legs or ends of the filament as is conducted by the center of the filament). As such, the ends (legs) of the filament provide a significant portion of the total heat conductivity/dissipation of the filament. In addition, the uniform cross section of the pigtail filament results in the establishment of a temperature gradient along the length of the filament, from the midpoint of the coil (hottest) to either leg of the coil (coolest).

Because electron emission is space charge limited, a large emission area of the filament is required to produce suitable electron emission. In order to raise a sufficient area of the filament to the temperature required to achieve thermionic electron emission, a "hot spot" is necessarily created within the temperature gradient of the filament, typically near the midpoint of the length of the coil. The electron emission rate near this midpoint is greater than at regions of lower temperature along the length of the coil. Because evaporation of filament material such as tungsten (W) depends exponentially on the electron emission rate, the hot spot produces much tungsten evaporation, which may eventually find its way to the surface of the wafer, thereby contaminating it. In addition, the high rate of evaporation of tungsten near the hot spot reduces the operational lifetime of the coil filament.

In addition to the non-uniform evaporation of tungsten along the length of a standard pigtail filament, which can cause wafer contamination, chemical contamination of the filament itself may occur. For example, the hot tungsten filament can chemically combine with nitrogen (N), which is outgassed from a photoresist-coated wafer during implantation, to form tungsten dinitride ($WN_2$) on its surface. Tungsten dinitride formation on the filament reduces its thermionic emissivity. To regain the desired level of emissivity, more electrical current needs to be provided to the filament, which further reduces its efficiency and lifetime.

The generally cylindrical shape of the body of a standard coil filament (i.e., circular cross section throughout the length thereof), also results in a filament which is characterized by a high thermal conductivity and heat capacity. Such a filament does not exhibit rapid thermionic emissivity changes in response to corresponding electrical current changes. Fast response time of a filament is important to be able to control the filament current during periods of outgassing.

Accordingly, it is an object of the present invention to provide a filament for a plasma shower in an ion implantation system which provides for a uniform temperature along the length thereof so as to provide a corresponding uniform thermionic electron emission characteristic, and which minimizes contamination of the filament and of the wafers being implanted by the system.

It is a further object of the present invention to provide a plasma shower filament having a low heat capacity and thermal conductivity such that its thermal emissivity is made rapidly responsive to changes in input electrical current.

It is still a further object of the present invention to provide a plasma shower filament which reduces heat conductivity from an active central portion thereof out to the filament legs, while maintaining sufficient emissive surface area of the central portion, and wherein heat generation is focused in the central portion and not conducted out through the legs.

It is still a further object of the invention to provide a filament for a plasma shower which uses less electrical power than known filaments.

It is yet a further object of the present invention to provide a filament for a plasma shower which reduces the potential for gas leaks about the interface of the filament and a plasma gas chamber in which it is mounted.

SUMMARY OF THE INVENTION

A ribbon filament is provided for a thermionic emission device. The filament comprises an elongated body having a configuration defined by a length, a width, and a thickness. The length comprises a central portion and first and second end portions on either side of the central portion. The width of the central portion is greater than that of the first and second end portions. In addition, the thickness of the filament is substantially less than the width along its entire length. Accordingly, the ribbon filament has a non-uniform cross sectional area along the entire length thereof.

In particular embodiments, the ribbon filament may be configured as a single helical coil having its first and second end portions mounted to first and second legs, respectively, at locations of slots therein. Preferably, the filament is comprised of tungsten and the first and second legs are also comprised of tungsten.

BRIEF DESCRIPTION OF THE DRAWINGS

FIG. 3 is a plan view of a filament assembly used in the plasma shower of FIG. 2 and constructed according to the principles of the present invention;

FIG. 4 is a side view of the filament assembly of FIG. 3;

FIG. 5 is an end view of the filament assembly of FIG. 3; and

FIG. 6 is a plan view of the filament portion of the filament assembly of FIGS. 3–5, shown in an elongated uninstalled state.

DETAILED DESCRIPTION OF A PREFERRED EMBODIMENT

Figure 1:
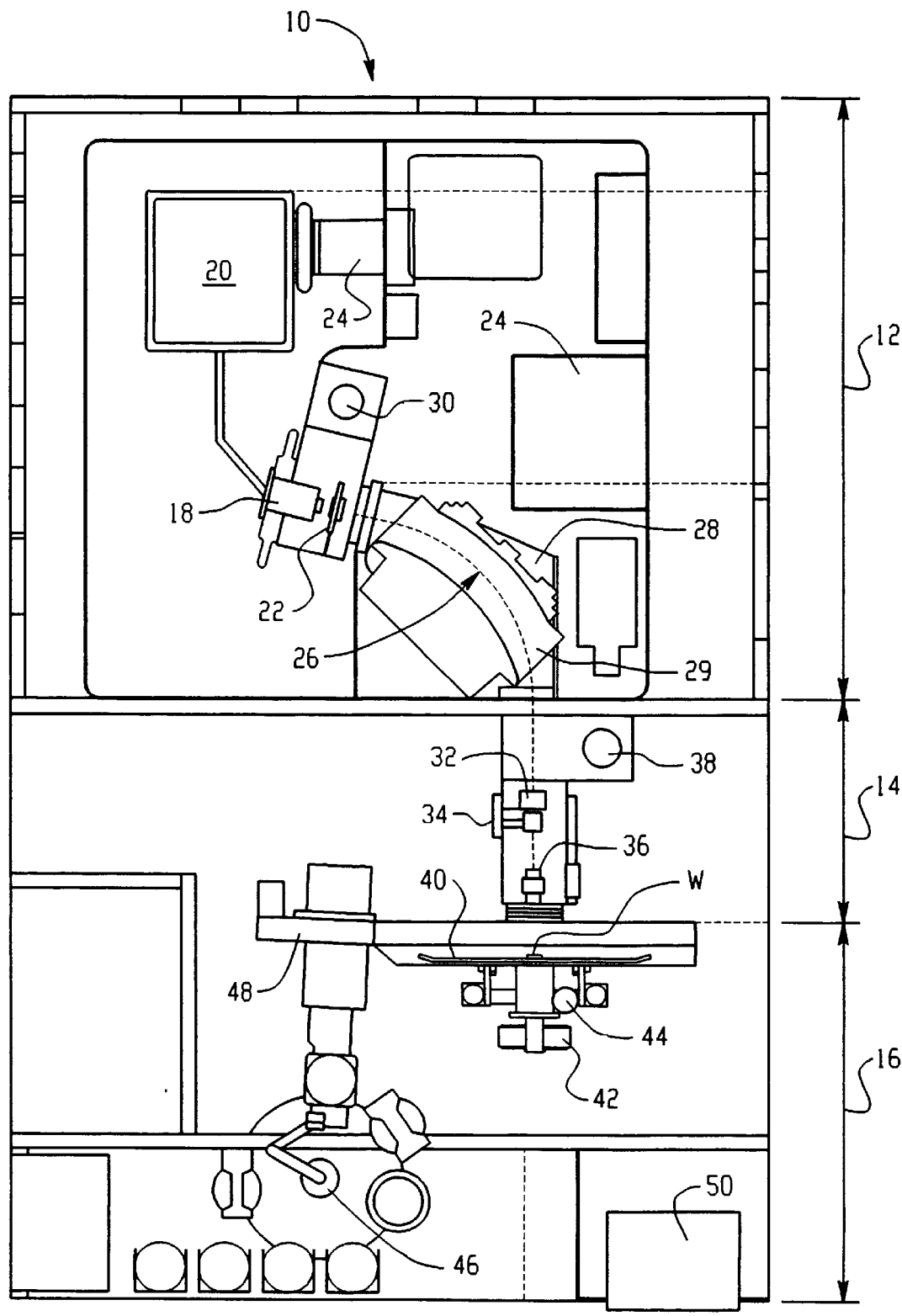
FIG. 1 is a plan view of an ion implantation system having a plasma shower incorporating one embodiment of a filament assembly constructed according to the principles of present invention.

Referring now to the drawings, FIG. 1 discloses an ion implanter, generally designated 10, which comprises a terminal 12, a beamline assembly 14 and a target or end station 16. Generally, the terminal 12 outputs an ion beam, and the beamline assembly 14 adjusts the focus and energy level of the ion beam and directs it toward a wafer W positioned at the end station 16.

The terminal 12 includes an ion source 18 having a chamber in which dopant gas from a gas box 20 is injected. Energy is imparted to the ionizable dopant gas to generate positive ions within the source chamber. An extraction electrode 22 powered by high voltage supply 24 extracts a beam 26 of positive ions from the source chamber and accelerates the extracted ions toward a mass analysis magnet 28. The mass analysis magnet 28 functions to pass only ions of an appropriate charge-to-mass ratio on to the beamline assembly 14. Evacuation of the beam path 29 provided by the mass analysis magnet 28 is provided by vacuum pump 30.

The beamline assembly 14 comprises a quadrature lens 32, a flag Faraday 34, a plasma shower 36, and, optionally, an ion beam acceleration/deceleration electrode (not shown in FIG. 1). The quadrature lens 32 focuses the ion beam output by the terminal 12 and the flag Faraday 34 measures ion beam characteristics during system setup. The plasma shower 36 contains the inventive filament assembly and is further explained below. The acceleration/deceleration electrode is used to accelerate or decelerate the focused ion beam to a desired energy level prior to implantation into a wafer at the target station 16. Evacuation of the beam path provided by the beamline assembly 14 is provided by vacuum pump 38.

The target station 16 includes a disk 40 upon which a plurality of target wafers are mounted, a rotary drive mechanism 42 for imparting rotational motion to the disk, and a linear drive mechanism 44 for imparting linear motion to the disk. A robotic arm 46 loads wafers onto the disk via a load lock chamber 48. Operation of the system is controlled by an operator control station 50 located at the end of the target station 16.

Figure 2:
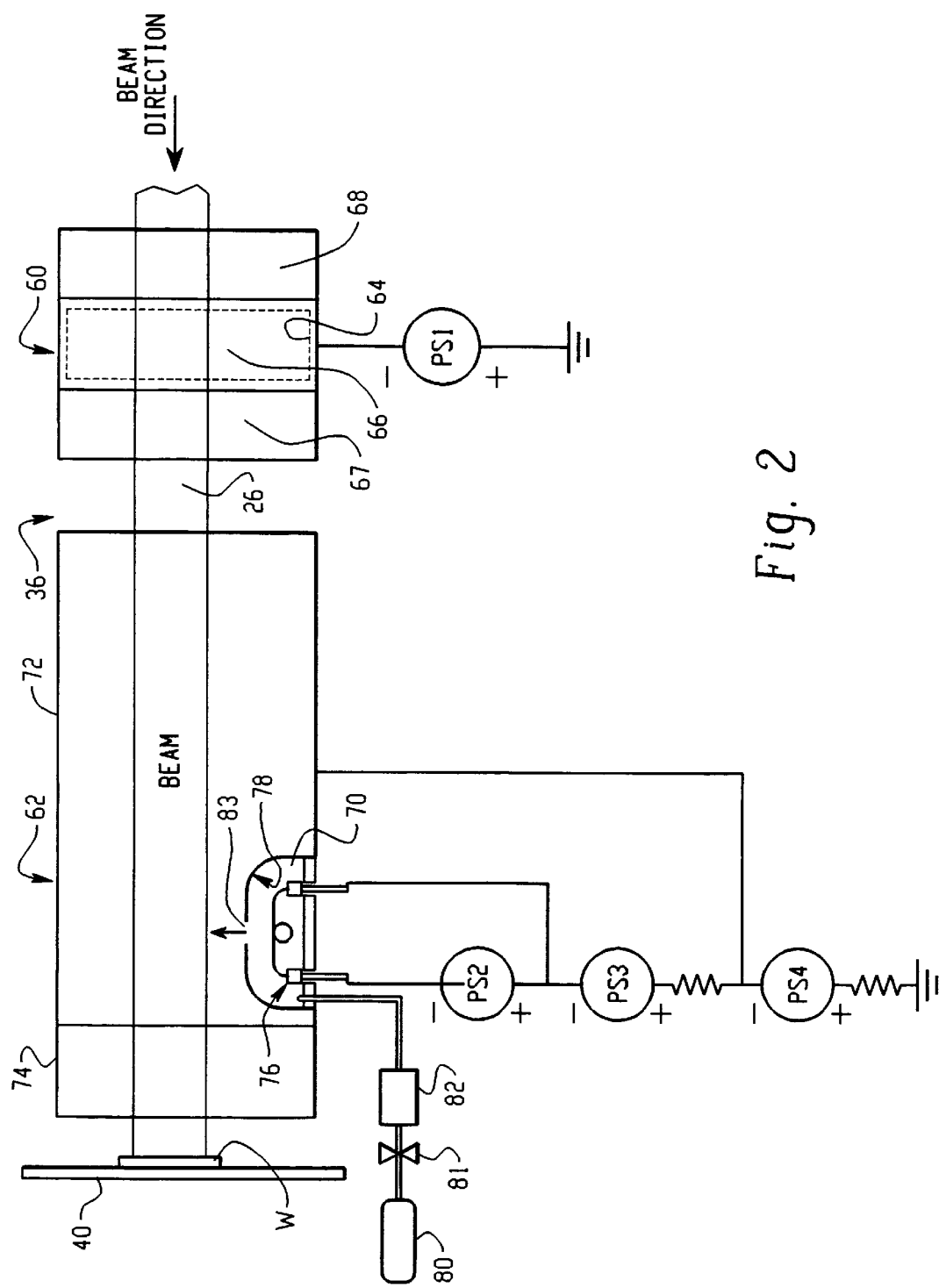
FIG. 2 is an enlarged plan view of the plasma shower of the system of FIG. 1.

The plasma shower 36 is shown in more detail in FIG. 2, and includes an electromagnetic reflector 60 and a flood gun assembly 62. The electromagnetic reflector 60 comprises a biased electrode 64 providing an aperture 66 through which the ion beam 26 passes, sandwiched between two ground electrodes 67 and 68. The ground electrodes 67 and 68 are formed by permanent magnets. Power supply PS1 applies a voltage potential of between −1 kilovolt (kV) and −3 kV to the biased electrode 64. The electromagnetic reflector 60 prevents electrons from drifting back upstream toward the terminal 12. At low beam energies, the biased electrode 64 is turned off, so that the reflector 60 relies only upon magnetic reflection, to avoid transmission power loss.

The flood gun assembly 62 comprises an arc chamber 70, a beam chamber tube 72, and an extension tube 74. Situated within the arc chamber is a filament assembly 76 which includes a filament 86 (see also FIGS. 3–6). The filament 86 is electrically heated to a thermionic emission temperature (approximately 2600° K). Filament current is provided by a filament power supply PS2 (approximately −5 V). An arc current is established between the filament 86 and an arc chamber wall 78 by an arc power supply PS (approximately −25 to −35 V), so that the potential difference between the filament and the wall 78 is approximately −20 to −30 V. This voltage is realized across a thin plasma sheath which forms around the filament 86, providing an electric field capable of extracting up to six amps of thermionic electron current from the filament.

A supply 80 of inert gas, such as argon, is injected into the chamber 70 by means of inlet valve 81 and mass flow controller 82, as is known in the art. A high density plasma, which includes low energy electrons, is generated within the arc chamber 70 by inert gas molecules which collide with higher energy electrons emitted by the filament 86. This high density plasma then diffuses, via an ambipolar diffusion process, through a small aperture 83 in the arc chamber wall 78. A low voltage (less than 12 V) power supply PS4 applies a potential to the extraction aperture to accelerate the diffusion process. The diffused high density plasma then interacts and enhances the beam plasma. Low energy electrons within the high density plasma become trapped within the generally positively charged ion beam to neutralize the net charge of the beam, which in turn reduces the positive charge accumulation on the wafer W as the ion beam strikes the wafer surface.

FIGS. 3–5 show the filament assembly 76 in greater detail. The assembly 76 comprises a pair of legs 85 and the filament 86 in the form of a single coil ribbon (separately shown in an uncoiled plan view in FIG. 6). In the preferred embodiment, the legs 85 are constructed from tungsten (W) and the filament 86 is also comprised of tungsten. Each of the tungsten legs 85 comprises a shaft 88 and a distal portion 90 which is thicker than the shaft. A shoulder 92 separates the shaft 88 from the distal portion 90.

The filament assembly 76 is installed in the plasma shower 36 such that the thick distal portions 90 reside totally within the arc chamber 70 and the shafts 88 extend through the arc chamber wall 78 and connect via conductors to the power supply PS2. The shoulders 92 on the legs 85 thereby rest on the interior of wall 78. Leakage of inert gas through the leg-chamber interface is minimized by the shoulder as escaping gas molecules, in order to escape, must first move in a first direction along the wall 78 (perpendicular to the axis of the shaft 88) and then move in a second direction along the axis of the shaft.

The ribbon filament 86 (FIG. 6) is formed into a single coil, the ends of which are fit into slots 94 in the distal portions 90 of the legs 85 and then electron-beam welded into place. The ribbon filament itself has a wide central portion 96 between two narrower end portions 98. The wide central portion 96 provides a sufficient surface area from which suitable rates of thermal emissivity may occur. In one embodiment, the ribbon filament 86 has a length of approximately 5.0–6.0 centimeters (cm), a width of approximately 2.0–3.0 cm, and a thickness of approximately 0.5 cm.

The small cross sectional area of the narrower end portions 98 of the filament reduce conductivity of heat from the wide central portion 96 to the legs 85. Such a configuration of non-uniform cross section also provides for even heat dissipation along the entire length of the filament so that no hot spots develop within the filament. By tailoring the width of the ribbon filament in this manner, a uniform temperature is obtained throughout the length of the filament, thereby achieving uniform thermionic emission from the ribbon filament, and avoiding areas of high tungsten evaporation.

With no hot spot developed along the length of the filament 86, tungsten contamination of the wafer is minimized. For example, it has been found that the use of the inventive filament has reduced tungsten contamination levels on processed wafers to less than five parts per million (5 ppm) whereas the use of known filaments results in contamination of greater than 50 ppm. Further, the elimination of hot spots on the filament 86 permits sufficient electron emission while operating at relatively low power levels. Power consumption of the inventive filament assembly 76 is on the order of 300 watts (W) as opposed to approximately 700 W for known plasma shower filaments. Most of the power (heat) generated/dissipated by the filament assembly 76 is expended by the filament 86 and not the legs 85, because the electrical resistivity (per unit length) of the filament is greater than that of the legs.

In addition, the ribbon configuration of the filament 86 provides for less thermal conductivity and heat capacity than known pigtail type filaments of circular cross section. The term "ribbon" filament as used herein shall mean a filament having a cross sectional area at points along its length which is substantially greater in one dimension (e.g., width) than the other (e.g., thickness), as opposed to known filaments which are, for example, circular in cross section. Accordingly, the ribbon filament is more thermally responsive to input power changes than known filaments. As a result, the control system controlling the filament current and arc current power supplies (PS2 and PS3) may more quickly react to current changes (e.g. arc current dropout) that can occur as the wafer outgasses, as well as to changes in thermionic emissivity which result from tungsten dinitride formation on the filament.

Accordingly, a preferred embodiment of an improved filament for an ion implanter plasma shower has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

I claim:

1. A ribbon filament (86) for a thermionic emission device, said filament comprising an elongated body having a configuration defined by a length, a width, and a thickness, said length comprising a central portion (96) and first and second end portions (98) on either side of said central portion, said width of said central portion being greater than that of said first and second end portions, said thickness of said filament being substantially less than said width along the entire length of said filament.

2. The ribbon filament (86) of claim 1, wherein said filament is configured as a single helical coil.

3. The ribbon filament (86) of claim 1, wherein said filament is comprised of tungsten.

4. The ribbon filament (86) of claim 1, wherein said length is approximately within the range of 5.0–6.0 centimeters (cm), said width is approximately within the range of 2.0–3.0 cm, and said thickness is approximately 0.5 cm.

5. A filament assembly (76) comprising:
   (i) a ribbon filament (86) for a thermionic emission device, said filament comprising an elongated body having a configuration defined by a length, a width, and a thickness, said length comprising a central portion (96) and first and second end portions (98) on either side of said central portion, said width of said central portion being greater than that of said first and second end portions, said thickness of said filament being substantially less than said width along the entire length of said filament; and
   (ii) first and second legs (85) attached, respectively, to the first and second end portions (98).

6. The filament assembly (76) of claim 5, wherein said filament (86) is configured as a single helical coil.

7. The filament assembly (76) of claim 5, wherein said filament (86) is comprised of tungsten and said first and second legs (85) are comprised of tungsten.

8. The filament assembly (76) of claim 5, wherein said first and second legs are provided with slots (94) into which said first and second end portions (98) are inserted.

9. The filament assembly (76) of claim 5, wherein each of said legs (85) is provided with a shaft (88) and a distal portion (90) separated by a shoulder (92).

10. The filament assembly (76) of claim 9, wherein said distal portion (90) is thicker than said shaft (88).

* * * * *